United States Patent
Regnier et al.

(10) Patent No.: US 12,125,899 B2
(45) Date of Patent: Oct. 22, 2024

(54) MOS TRANSISTOR HAVING SUBSTANTIALLY PARALLELEPIPED-SHAPED INSULATING SPACERS

(71) Applicant: STMICROELECTRONICS (ROUSSET) SAS, Rousset (FR)

(72) Inventors: Arnaud Regnier, Les Taillades (FR); Dann Morillon, Le Versoud (FR); Franck Julien, La Penne sur Huveaune (FR); Marjorie Hesse, Rousset (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 17/180,197

(22) Filed: Feb. 19, 2021

(65) Prior Publication Data
US 2021/0175346 A1 Jun. 10, 2021

Related U.S. Application Data

(62) Division of application No. 16/228,032, filed on Dec. 20, 2018, now Pat. No. 10,930,757.

(30) Foreign Application Priority Data

Jan. 4, 2018 (FR) ...................... 1850048

(51) Int. Cl.
*H01L 29/66* (2006.01)
*H01L 21/28* (2006.01)
(Continued)

(52) U.S. Cl.
CPC .. *H01L 29/66568* (2013.01); *H01L 21/28114* (2013.01); *H01L 21/28132* (2013.01); *H01L 21/823468* (2013.01); *H01L 21/84* (2013.01); *H01L 27/1207* (2013.01); *H01L 29/41775* (2013.01); *H01L 29/42372* (2013.01);
(Continued)

(58) Field of Classification Search
CPC ....... H01L 21/28114; H01L 21/823468; H01L 21/823456; H01L 21/7624; H01L 21/76291; H01L 29/6656; H01L 27/1203; H01L 27/1211; H01L 29/66568; H01L 29/66689; H01L 21/28132; H01L 29/7833; H01L 29/42376; H01L 29/66628;
(Continued)

(56) References Cited

U.S. PATENT DOCUMENTS 6,180,501 B1 * 1/2001 Pey ...................... H01L 29/4925
438/303
6,271,563 B1 * 8/2001 Yu ...................... H01L 29/66643
257/408
(Continued)

FOREIGN PATENT DOCUMENTS

JP 8-255846 A 10/1996

OTHER PUBLICATIONS

Cornu-Fruleux, F. et al., "Spacer-First Damascene-Gate FinFET Architecture Featuring Stringer-Free Integration," IEEE Electron Device Letters 28(6):523-526, Jun. 2007.

*Primary Examiner* — Khiem D Nguyen
(74) *Attorney, Agent, or Firm* — Seed IP Law Group LLP

(57) ABSTRACT

A method of manufacturing a MOS transistor includes forming a conductive first gate and forming insulating spacers along opposite sides of the gate, wherein the spacers are formed before the gate.

18 Claims, 4 Drawing Sheets

(51) Int. Cl.
  *H01L 21/8234* (2006.01)
  *H01L 21/84* (2006.01)
  *H01L 27/12* (2006.01)
  *H01L 29/417* (2006.01)
  *H01L 29/423* (2006.01)
  *H01L 29/78* (2006.01)
  *H01L 29/786* (2006.01)
(52) U.S. Cl.
  CPC .... *H01L 29/42376* (2013.01); *H01L 29/6656* (2013.01); *H01L 29/66659* (2013.01); *H01L 29/66772* (2013.01); *H01L 29/7833* (2013.01); *H01L 29/78654* (2013.01)
(58) Field of Classification Search
  CPC ................. H01L 21/84; H01L 27/1207; H01L 27/28114; H01L 27/086
  USPC ........................................................ 257/401
  See application file for complete search history.

(56) References Cited

U.S. PATENT DOCUMENTS

| | | | |
|---|---|---|---|
| 8,440,519 | B2 | 5/2013 | Ellis-Monaghan et al. |
| 8,492,228 | B1 | 7/2013 | Leobandung et al. |
| 8,999,791 | B2 | 4/2015 | Cheng et al. |
| 9,059,267 | B1* | 6/2015 | Majumdar .......... H01L 29/7848 |
| 9,449,833 | B1* | 9/2016 | Regan ............... H01L 21/28114 |
| 9,666,684 | B2* | 5/2017 | Basu ............... H01L 29/66462 |
| 9,755,059 | B2* | 9/2017 | Sriram ................. H01L 29/402 |
| 10,546,924 | B2* | 1/2020 | Bangsaruntip ....... H10K 10/491 |
| 2002/0056859 | A1* | 5/2002 | Horstmann ....... H01L 29/42376 |
| | | | 257/E21.205 |
| 2002/0168823 | A1 | 11/2002 | Tseng |
| 2004/0104433 | A1 | 6/2004 | Ieong et al. |
| 2004/0227154 | A1* | 11/2004 | Chu .................... H01L 29/7782 |
| | | | 257/E29.049 |
| 2004/0259342 | A1* | 12/2004 | Chang .................. H01L 29/665 |
| | | | 257/E21.205 |
| 2006/0113605 | A1* | 6/2006 | Currie ..................... H01L 21/84 |
| | | | 257/E29.296 |
| 2007/0096200 | A1* | 5/2007 | Lee ..................... H01L 29/7881 |
| | | | 257/E29.302 |
| 2007/0134865 | A1* | 6/2007 | Shukuri ................. H10B 43/30 |
| | | | 257/E21.679 |
| 2008/0274595 | A1 | 11/2008 | Spencer et al. |
| 2009/0020801 | A1* | 1/2009 | Liao .................. H01L 29/42324 |
| | | | 257/E21.422 |
| 2009/0020806 | A1* | 1/2009 | Anderson ............... H01L 29/78 |
| | | | 257/E21.409 |
| 2009/0159990 | A1* | 6/2009 | Park ...................... H01L 29/515 |
| | | | 438/301 |
| 2010/0078736 | A1* | 4/2010 | Hoentschel ......... H01L 29/6656 |
| | | | 257/E21.409 |
| 2013/0309868 | A1 | 11/2013 | Cai et al. |
| 2014/0264624 | A1 | 9/2014 | Yen et al. |
| 2014/0367788 | A1* | 12/2014 | Xie .................... H01L 29/42356 |
| | | | 438/587 |
| 2015/0108590 | A1* | 4/2015 | Alptekin ............... H01L 29/517 |
| | | | 257/411 |
| 2015/0162425 | A1* | 6/2015 | Majumdar .......... H01L 29/7848 |
| | | | 257/194 |
| 2015/0243693 | A1* | 8/2015 | Oh .................... H01L 27/14638 |
| | | | 257/292 |
| 2015/0357467 | A1 | 12/2015 | Jain et al. |
| 2016/0276451 | A1* | 9/2016 | Golanski ............ H01L 27/1207 |
| 2017/0025442 | A1* | 1/2017 | Flachowsky .......... H01L 21/308 |
| 2017/0077097 | A1* | 3/2017 | Dong ............... H01L 29/66545 |
| 2017/0200743 | A1* | 7/2017 | Flachowsky ...... H01L 29/42376 |
| 2018/0226477 | A1* | 8/2018 | Jain ...................... H01L 29/665 |
| 2018/0269295 | A1* | 9/2018 | Shank ................. H01L 29/4991 |

* cited by examiner

MOS TRANSISTOR HAVING SUBSTANTIALLY PARALLELEPIPED-SHAPED INSULATING SPACERS

CROSS-REFERENCE TO RELATED APPLICATIONS

This application is a divisional application of U.S. patent application Ser. No. 16/228,032, filed Dec. 20, 2018, issued as U.S. Pat. No. 10,930,757, which claims the priority benefit of French patent application number 1850048, filed on Jan. 4, 2018, the content of which applications is hereby incorporated by reference in its entirety to the maximum extent allowable by law.

BACKGROUND

Technical Field

The present disclosure concerns MOS transistors and a method of manufacturing the same. More specifically, the present disclosure concerns the manufacturing of transistor spacers.

Description of the Related Art

MOS transistors comprise spacers, that is, electrically-insulating elements located in contact with the gate on the drain side and on the source side. Spacers enable, among others, to protect certain areas during the doping of the drain and source regions to separate the drain and source regions, which have a relatively strong doping, from the channel region. Further, the wider the spacers, the higher the input resistance, the lower the lateral electric field. Thus, transistors having to withstand relatively high powers typically employ relatively large spacers.

BRIEF SUMMARY

At least one embodiment overcomes all or part of the disadvantages of usual transistor manufacturing methods.

At least one embodiment provides a method of manufacturing a first MOS transistor wherein spacers are formed before the gate.

According to at least one embodiment, the spacers are parallelepiped-shaped.

According to at least one embodiment, the method comprises the steps of: a1) depositing a layer of insulator; and b1) etching the insulator layer to form the spacers.

According to at least one embodiment, the method comprises the steps of: a2) oxidizing a layer of semiconductor material of a substrate of silicon-on-insulator type, in an area where the gate will be located; b2) etching the insulator layer obtained after the oxidation to form the spacers.

According to at least one embodiment, the method comprises the subsequent steps of: c) depositing a layer of conductive material; and d) etching the layer of conductive material to form the gate between spacers.

According to at least one embodiment, at least one second transistor, having its spacers formed after the gate, is formed around the first transistor.

According to at least one embodiment, the insulator layer is a protection layer used during the forming of said at least one transistor having its spacers formed after the gate.

At least one embodiment provides a MOS transistor having spacers which are substantially parallelepiped-shaped.

According to at least one embodiment, the gate partially covers the spacers.

According to at least one embodiment, two spacers have different widths.

The foregoing and other features and advantages will be discussed in detail in the following non-limiting description of specific embodiments in connection with the accompanying drawings.

DETAILED DESCRIPTION

Figure 1A:
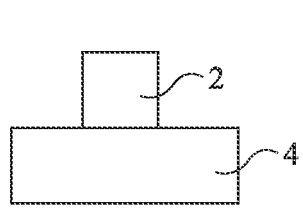
FIGS. 1A to 1C very schematically show a usual spacers manufacturing method.

The same elements have been designated with the same reference numerals in the various drawings and, further, the various drawings are not to scale. For clarity, only those steps and elements which are useful to the understanding of the described embodiments have been shown and are detailed. In particular, the forming of the drain and source regions, including their doping, is not detailed.

In the following description, when reference is made to terms qualifying absolute positions, such as terms "left," "right," etc., or relative positions, such a terms "top," "upper," "lower," etc., or to terms qualifying orientation, such as term "horizontal," "vertical," reference is made to the orientation of the concerned elements in the drawings. The terms "approximately" and "substantially" are used herein to designate a tolerance of plus or minus 10%, preferably of plus or minus 5%, of the value in question.

Figure 1B:
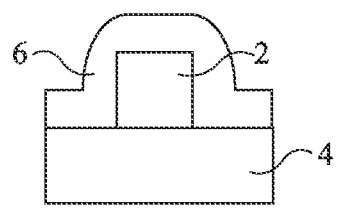
Figure 1C:
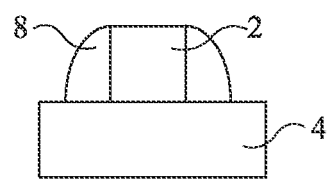

FIGS. 1A to 1C very schematically show a usual spacer manufacturing method. At the step of FIG. 1A, a gate 2 is formed on a substrate 4. At the step of FIG. 1B, a layer 6 of insulating material, for example, silicon oxide, is deposited over the structure of the step illustrated in FIG. 1A. At the step of FIG. 1C, layer 6 is anisotropically etched to form spacers 8 covering the lateral walls of gate 2.

Spacers 8 have, due to their manufacturing method, a width varying from a maximum value at the level of substrate 4 to a minimum value close to zero at the level of the upper surface of gate 2. Further, the maximum value of the width of spacers 8 is dependent on the height of gate 2.

Thus, decreasing the height of the transistors causes a decrease in the width of spacers 8, which may become a problem, according to the voltage that the transistors have to withstand. This is for example true for transistors having to withstand voltages higher than approximately 5 V.

Figure 2A:
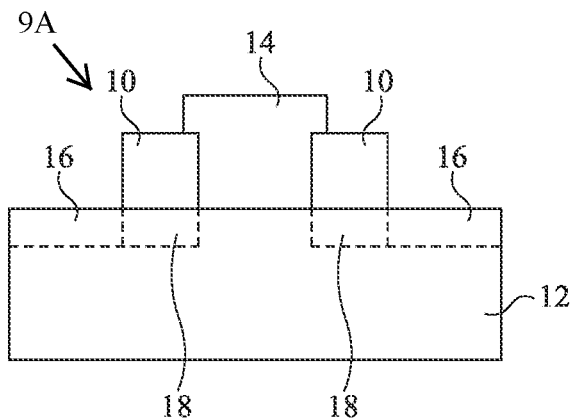
FIGS. 2A and 2B schematically show two embodiments of spacers.
Figure 2B:
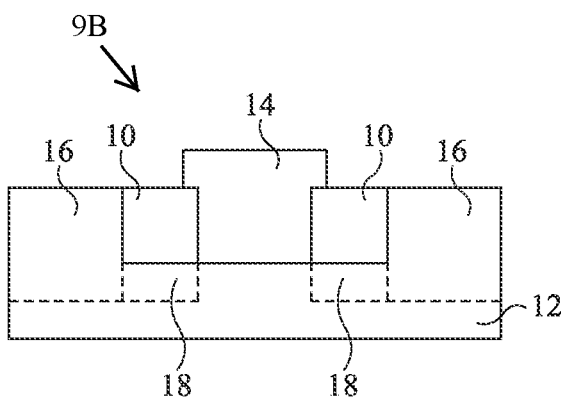

FIGS. 2A and 2B are cross-section views schematically showing two embodiments of MOS transistors 9A, 9B located on a chip. The transistors 9A, 9B of FIGS. 2A and 2B are each located inside and on top of a substrate 12 and each comprise a gate 14, and drain and source regions 16 relatively heavily doped with respect to substrate 12. The transistors further comprise spacers 10 located between gate 14 and the source and drain regions 16 in contact with the lateral walls of the gate.

According to the described embodiments, spacers 10 each have a substantially parallelepipedal shape. More specifically, in the cases of FIGS. 2A and 2B, spacers 10 are cuboid-shaped. Thus, the width, that is, the horizontal dimension in the plane of FIGS. 2A and 2B, of each spacer is substantially constant along its entire height and independent from the height of gate 14.

Areas 18 of substrate 12, located directly under spacers 10, are protected during the doping of the source and drain regions and are thus less heavily doped than source and drain regions 16. The width of areas 18 thus depends on the width of spacers 10.

In the case of the spacers described in relation with FIGS. 2A and 2B, the height of each gate 14 is greater than the height of its spacers 10. Thus, the lateral walls of each gate 14 are only partially covered with spacers 10. Further, the width of the upper portion of each gate 14 is here greater than the distance between its spacers 10. The upper portion of each gate 14 thus partially covers the upper surface of its spacers 10. In other words, gates 14 have a T-shaped cross-section in the plane of FIGS. 2A and 2B. As a variation, each gate 14 and its spacers 10 may have the same height.

In the embodiment of FIG. 2A, spacers 10 and gate 14 are located on the substrate 12.

In the embodiment of FIG. 2B, spacers 10 are buried in substrate 12 and their upper surface is in the same horizontal plane as the upper surface of substrate 12. The lower surface of gate 14 and the lower surface of spacers 10 are in a same plane in substrate 12. In the case of the example of FIG. 2B, an upper portion of gate 14 protrudes above the plane of the upper surface of substrate 12 and of spacers 10.

FIGS. 3A to 3D are cross-section views schematically showing the result of steps of a method of manufacturing the embodiment of FIG. 2A. A right-hand portion 20 of FIGS. 3A to 3D illustrates the result of steps of manufacturing the embodiment of FIG. 2A and a left-hand portion 22 illustrates the manufacturing of other components, for example, other transistors. The structures of right-hand 20 and left-hand 22 portions are separated by an electrically-insulating trench 24.

The structure of left-hand portion 22 comprises, on a substrate 26, an insulator layer 28 and a silicon layer 30, forming an SOI or "Silicon on Insulator" structure. Transistors of the type in FIG. 2A may also be formed in and on a non-SOI monocrystalline semiconductor chip, such as a silicon chip.

A layer 32 of insulator, for example, of silicon nitride or of silicon nitride, is deposited over the entire structure. The thickness of insulator layer 32 is equal to the desired height of spacers 10. Insulator layer 32 is then partially etched through a mask to form two parallelepiped spacers 10 separated by the desired width of the gate and having the desired spacer dimensions.

Insulator layer 32 may also be used as a protection layer for other areas of the chip. For example, layer 32 covers and protects layer 30 of semiconductor material of the SOI structure of the left-hand portion 22 of FIG. 3A and a portion of insulating trench 24. Such a protection layer 32 is generally provided in methods of co-integration of a plurality of transistor types. Thus, an advantage of this embodiment is that it can use a manufacturing step already present for the step of FIG. 3A with only a modification of the mask.

The structure of right-hand portion 20 comprises, on substrate 26 and around the parallelepipeds forming spacers 10, a layer 31 of insulator, for example, of silicon oxide. Layer 31 will form the gate insulator of the transistor of right-hand portion 20.

Figure 3A:
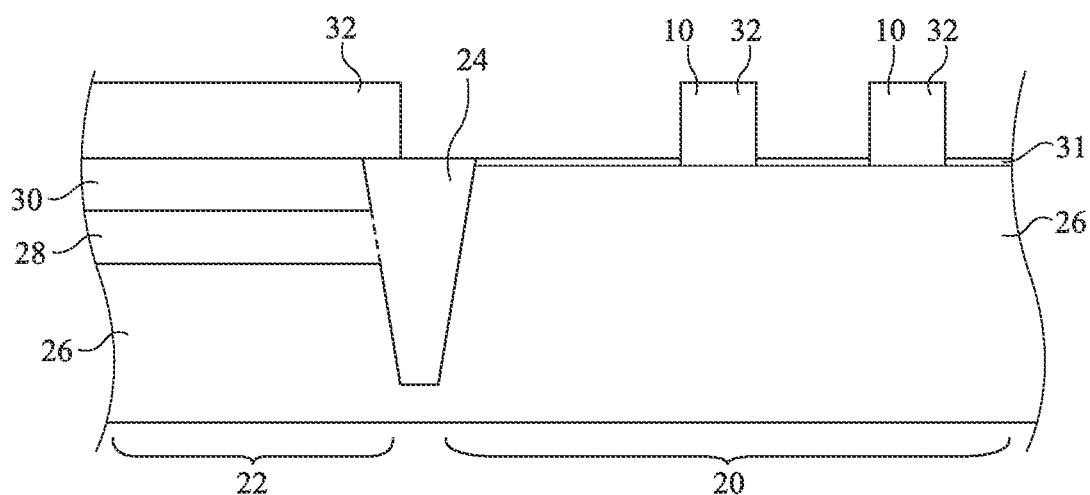
FIGS. 3A to 3D schematically show a method of manufacturing the embodiment of FIG. 2A.
Figure 3B:
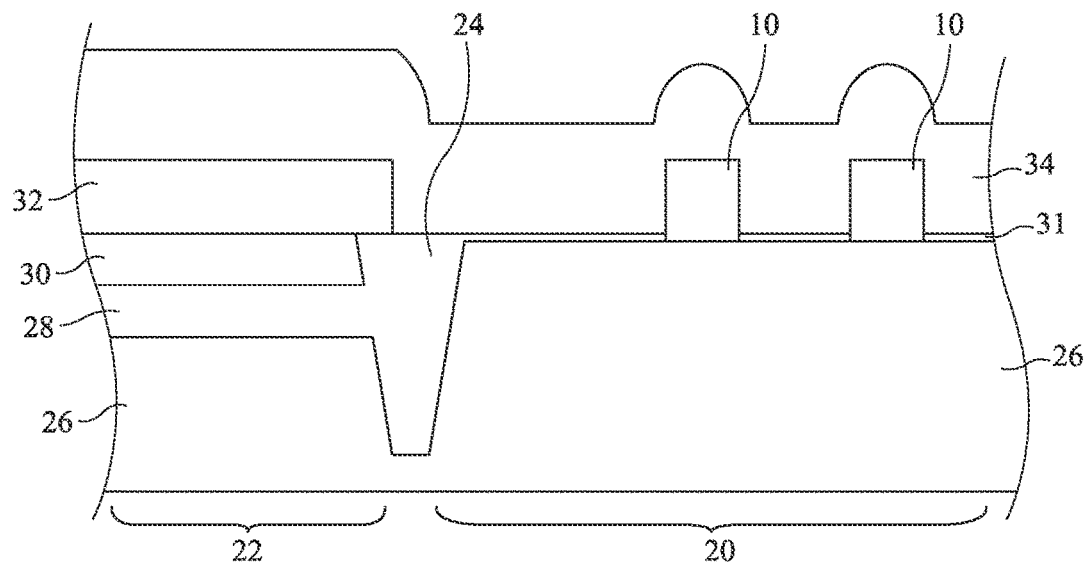

FIG. 3B shows the result of a step of depositing a layer 34 of a conductive gate material, for example, polysilicon, on the structure of FIG. 3A. Gate conductor layer 34 has a thickness equal to the height of the gate desired in right-hand portion 20.

Figure 3C:
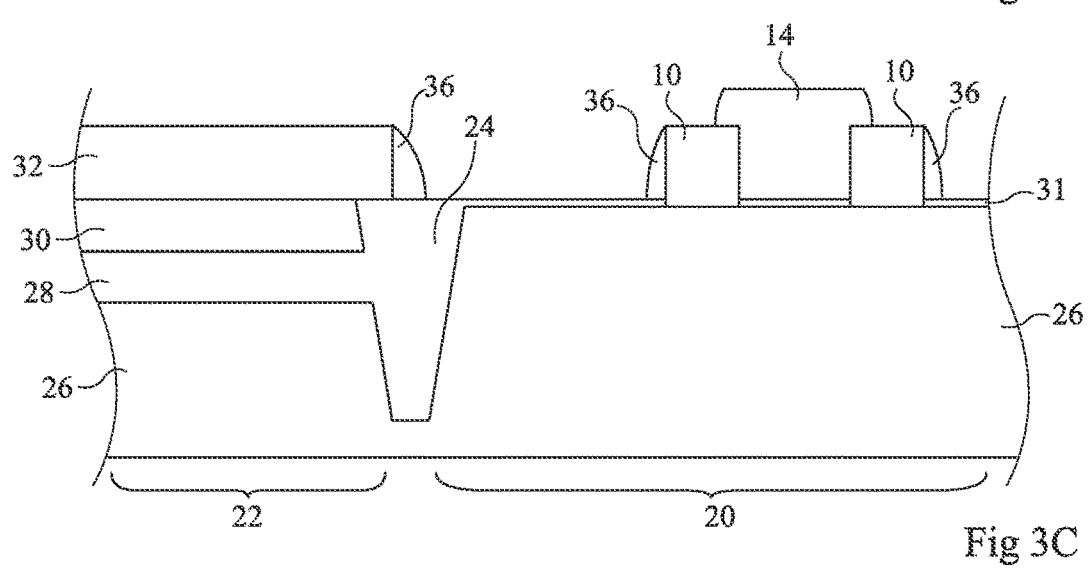

FIG. 3C shows the result of a step of depositing an etch mask, not shown, and of an etch step. The mask protects the portion of layer 34 forming gate 14, that is, the area between spacers 10. An anisotropic etching is performed to remove the portions of layer 34 which are not protected by the mask. Preferably, the mask is placed and sized so that, as shown in FIG. 3C, gate 14 totally fills the space between spacers 10 and the upper portion of the gate partially covers spacers 10.

Areas 36 of the gate material may remain at the level of the lateral walls of protection layer 32 and of spacers 10. The width of the spacers can be adjusted so that areas 36 have no influence on the operation of the formed transistor.

Figure 3D:
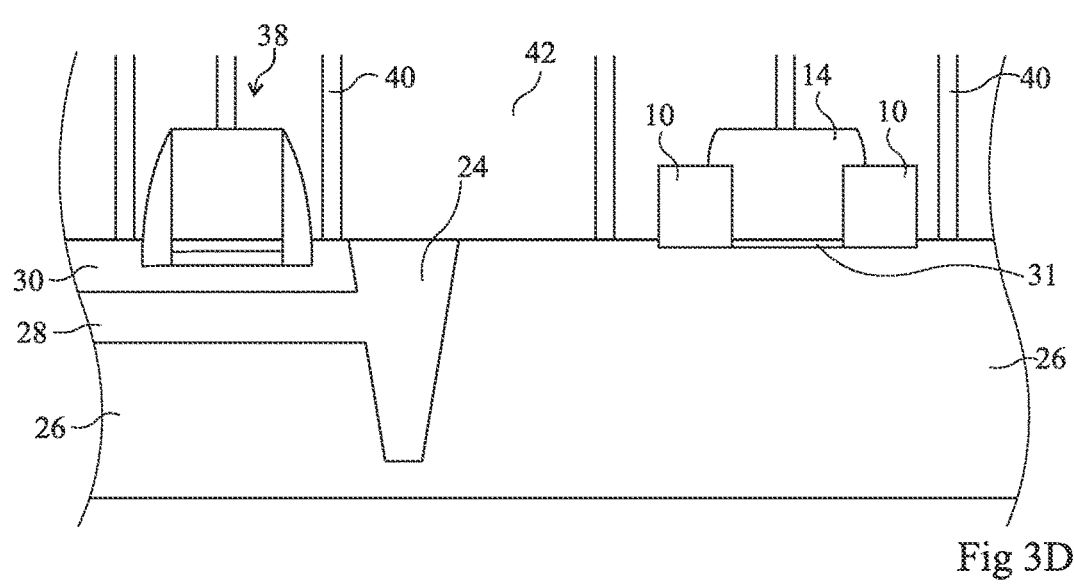

FIG. 3D illustrates a manufacturing step that removes the portions of the insulator layer 31 not covered by the gate 14, as well as protection layer 32 and areas 36. The other transistors of the chip are formed later on in a usual way. For example, a transistor 38 is shown in the left-hand portion of FIG. 3D.

Vias 40, connecting the different portions of the transistors of the right-hand and left-hand portions, are formed in an insulating layer 42 covering the transistors.

It is possible to add a step of epitaxial growth of the semiconductor material of layer 30 and of substrate 26 taking place before the forming of vias 40, but after the step of FIG. 3C.

An advantage of the parallelepipedal shape of spacers 10 is that, for an epitaxial growth along a height shorter than the height of spacers 10, the distance between gate 14 and the epitaxial semiconductor material remains constant all along the length of the spacers, which is not true for spacers formed by the usual method described in relation with FIG. 1. Further, the distance between gate 14 and the epitaxial semiconductor material is conditioned by the width of spacers 10, which enables to adjust the electric field in spacers 10. Indeed, the wider the spacers, the lower the electric field in the spacers.

FIGS. 4A to 4G are cross-section views schematically showing a manufacturing method of the embodiment of FIG. 2B. FIGS. 4A to 4G comprise, as previously, a right-hand portion where the transistor of FIG. 2B will be formed and a left-hand portion where another transistor will be formed.

Figure 4A:
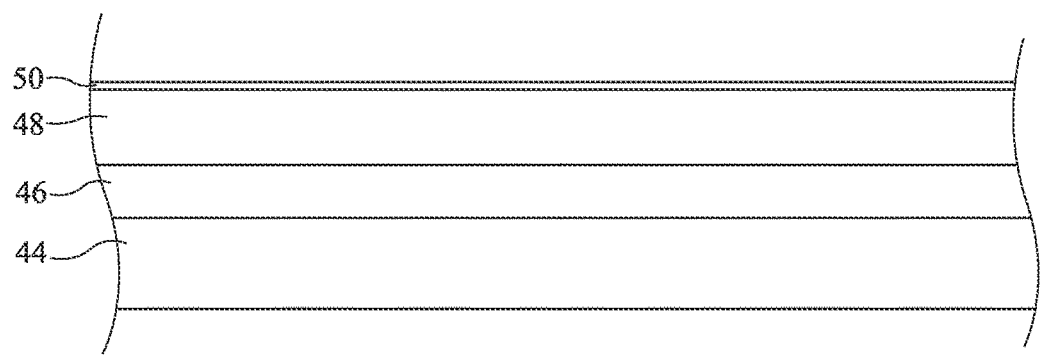
FIGS. 4A to 4G schematically show a method of manufacturing the embodiment of FIG. 2B.

FIG. 4A illustrates an initial manufacturing step, during which an SOI (silicon on insulator) structure is formed. The chip thus comprises a substrate 44 made of a semiconductor material, for example, silicon, covered with a layer 46 of insulator, for example, silicon oxide. Layer 46 is itself covered with a layer 48 of semiconductor material, for example, silicon. Layer 48 of semiconductor material is covered with a layer 50 of insulator.

Figure 4B:
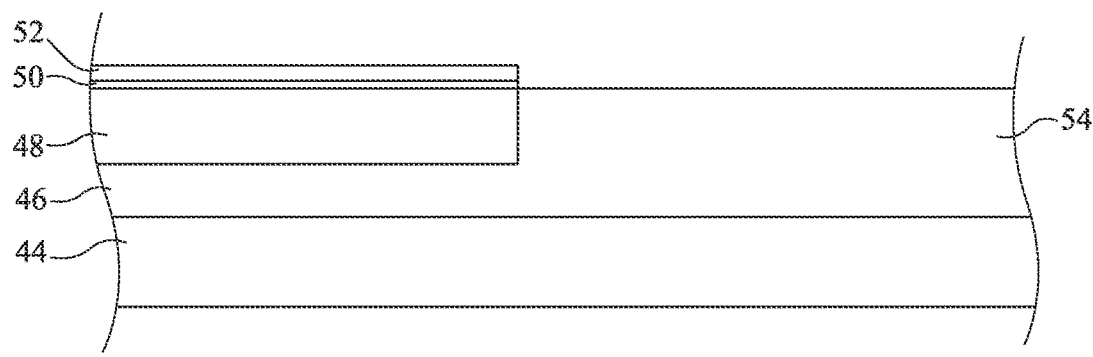

FIG. 4B illustrates a step during which a mask 52, for example, a hard mask, is deposited over the structure of FIG. 4A. Mask 52 comprises an opening located opposite the area where the transistor of FIG. 2B will be formed, here, the right-hand portion of FIG. 4B. Layer 50 is for example removed opposite this opening. An oxidation is then performed so that the right-hand portion then only comprises substrate 44 covered with a layer 54 of insulator, for example, silicon oxide.

Figure 4C:
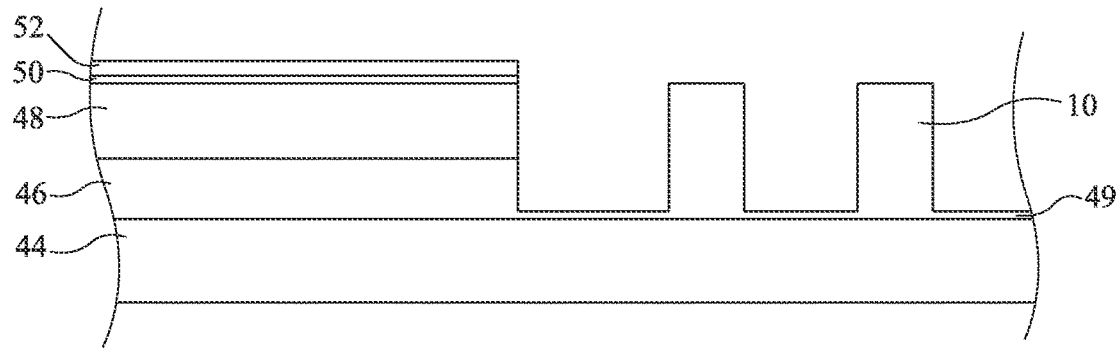

FIG. 4C illustrates a next manufacturing step during which insulator layer 54 of the right-hand portion is etched to form spacers 10. The distance between the two spacers is selected according to the dimensions of gate 14 of the desired transistor. The height of the spacers corresponds to the combined thickness of layer 46 and of layer 48 of semiconductor material. There may remain an insulator layer 49 above substrate 44 in the right-hand portion, around spacers 10. This layer may be removed before forming the gate oxide of the transistor by thermal growth or by deposition.

Figure 4D:
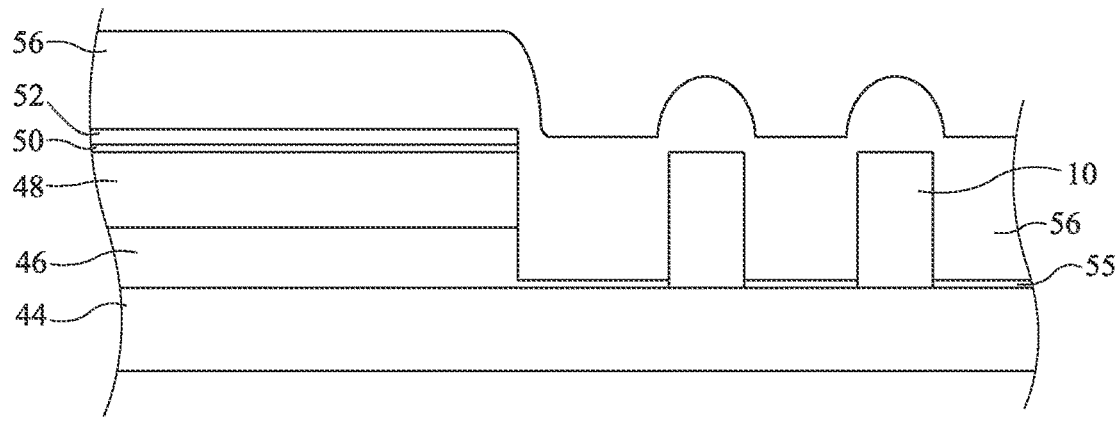

FIG. 4D shows a step of depositing an insulator layer 55 around the spacers, which will form the gate insulator, and a gate conductor material layer 56 over the entire chip. The thickness of layer 56 is equal to the desired gate height 14 of the transistor.

Figure 4E:
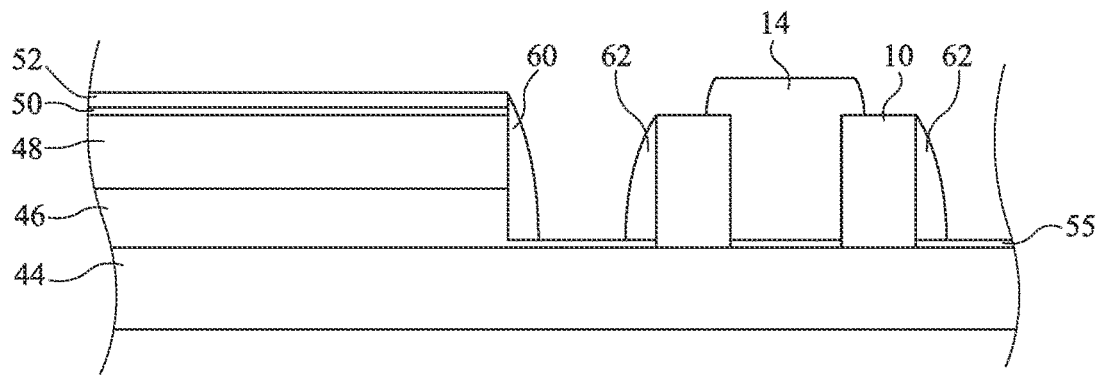

FIG. 4E shows a step of etching layer 56 of the gate conductor material. As at the step of FIG. 3C, the etching is performed so that layer 56 totally fills the space between spacers 10 and possibly that the upper portion of the gate partially covers the spacers.

Areas 60 and 62, made of the gate conductor material having a shape similar to that of the spacers obtained in FIGS. 1A to 1C, form on the lateral walls of the spacers (areas 62) and on the lateral wall of the left-hand portion (area 60).

Figure 4F:
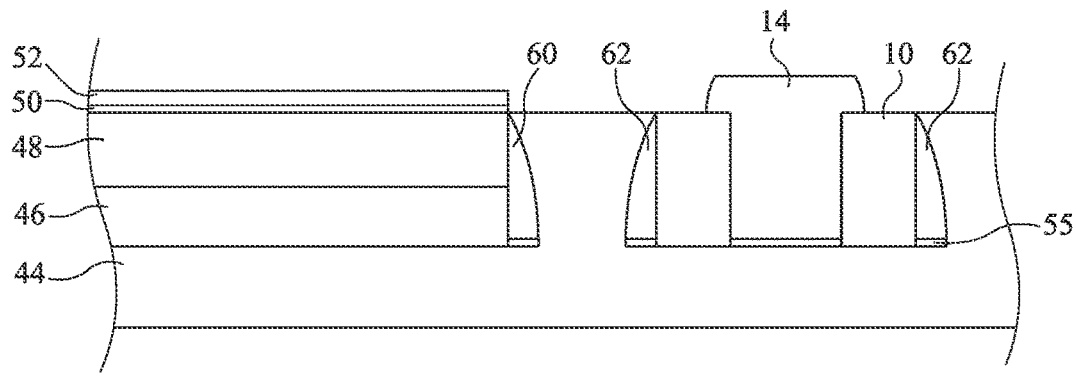

FIG. 4F illustrates a next manufacturing step. The exposed portions of gate insulator layer 55 are removed and an epitaxy is carried out to grow the semiconductor material of substrate 44 up to the level of the upper surface of spacers 10, which also corresponds to the upper surface of layer 48 of semiconductor material.

Figure 4G:
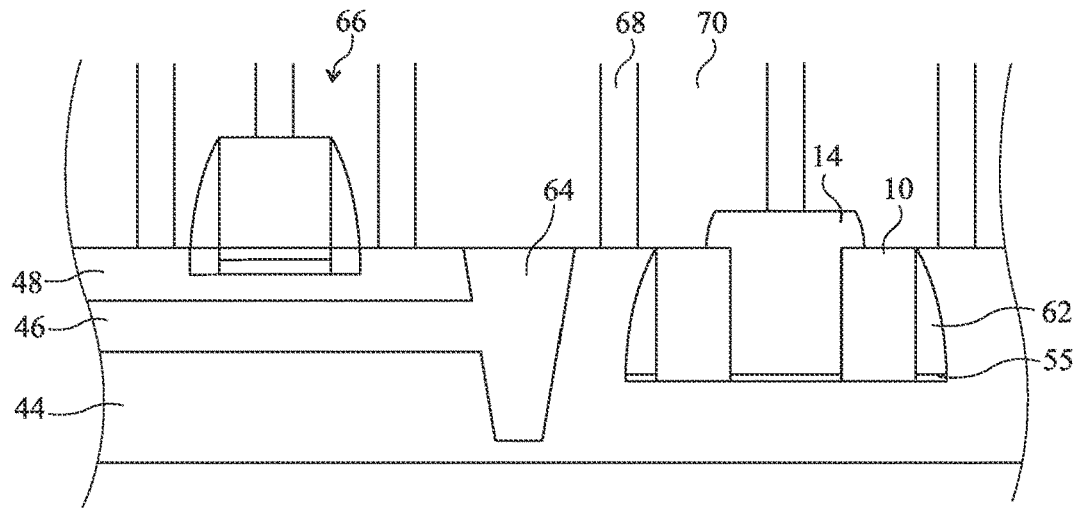

FIG. 4G illustrates a subsequent manufacturing step. During this step, various usual elements are formed. For example, in FIG. 4G, an insulating trench 64 is formed between the left-hand and right-hand structures and a transistor 66 is formed in the left-hand portion. Insulating trench 64 is formed at the level of area 60 of gate conductor, to remove it. Vias 68 are then formed, in an insulating layer 70 covering the structure, to form connections.

Figure 5:
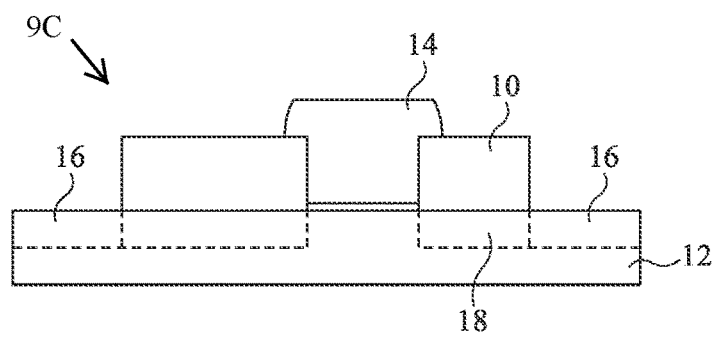
FIG. 5 schematically shows another embodiment of spacers.

FIG. 5 schematically shows another embodiment of a MOS transistor 9C. FIG. 5 shows same elements as FIGS. 2A and 2B, designated with the same reference numerals. The structure of FIG. 5 may be manufactured by the method of FIGS. 3A to 3D or by the method of FIGS. 4A to 4G.

The two spacers 10 shown in FIG. 5 have different widths. Indeed, in the previously-described manufacturing methods, the horizontal dimensions, including the spacer width, advantageously do not depend on the gate height but only on the dimensions of the openings of the etch masks, and it is thus possible to select different widths for the spacer on the drain side and for the spacer on the source side. Further, in the embodiment of FIGS. 3A to 3D, the height of spacers 10 may be freely selected by selecting the thickness of insulator layer 32. In the embodiment of FIGS. 4A to 4G, the height of the spacers depends on the thicknesses of layers 46 of insulator 48 and of semiconductor material of the SOI structure.

An advantage of the described embodiments is that the width of the spacers does not depend on the gate height.

Specific embodiments have been described. Various alterations, modifications, and improvements will occur to those skilled in the art. In particular, each described gate has a height greater than the height of its spacers. Each gate 14 may however have the same height as its spacers. The upper surface of each gate is then in the same plane as the upper surface of the spacers.

Further, the described embodiments may be applied to any structure comprising MOS transistors, for example, memory cells.

In addition, any of the transistors 9A-9C may be formed in and on a non-SOI monocrystalline semiconductor chip, such as a silicon chip.

Such alterations, modifications, and improvements are intended to be part of this disclosure, and are intended to be within the spirit and the scope of the present disclosure. Accordingly, the foregoing description is by way of example only and is not intended to be limiting. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MOS transistor comprising:
 a conductive gate;
 source and drain regions adjacent to the conductive gate; and
 first and second insulating spacers which are substantially parallelepiped-shaped and on opposite sides of the conductive gate;
 a first conductive spacer on a first side of the first insulating spacer, the first insulating spacer having a second side, opposite to the first side, that contacts the conductive gate; and
 a second conductive spacer on a first side of the second insulating spacer, the second insulating spacer having a second side, opposite to the first side of the second insulating spacer, that contacts the conductive gate.

2. The transistor of claim 1, wherein the conductive gate partially covers the first and second insulating spacers.

3. The transistor of claim 1, wherein the first insulating spacer has a different width than the second insulating spacer.

4. The transistor of claim 1, wherein the conductive gate has a height that is greater than a height of the first and second insulating spacers.

5. The transistor of claim 1, wherein the conductive gate is on a silicon-on-insulator substrate.

6. An integrated circuit comprising:
 a first semiconductor layer;
 a first MOS transistor on and in the first semiconductor layer that includes:
  a first gate conductor extends into the first semiconductor layer;
  first source and drain regions adjacent to the first gate conductor;
  insulating first and second spacers which are substantially parallelepiped-shaped and on opposite sides of the first gate conductor, the insulating first and second spacers each including a first surface and a second surface transverse to the first surface, the first gate conductor overlapping and in contact with the first surfaces, the first gate conductor in contact with the second surfaces, the insulating first and second spacers are within the first semiconductor layer and the first surfaces of the insulating first and second spacers are exposed from the first semiconductor layer; and conductive first and second spacers in contact with a corresponding one of the insulating first and second spacers, the conductive first and second spacers are within the first semiconductor layer;

an insulator layer extending into the first semiconductor layer, the insulator layer including an insulating trench that extends into the first semiconductor layer;

a second semiconductor layer on the insulator layer;

a second MOS transistor on the second semiconductor layer; and an insulating layer on the first MOS transistor, the second MOS transistor, on the second semiconductor layer, and on the insulating trench of the insulator layer, and the insulating layer contacts the insulating trench of the insulator layer, and wherein the second semiconductor layer and the insulator layer are between the second MOS transistor and the first semiconductor layer, the insulating trench is between the first MOS transistor and the second MOS transistor, and the first MOS transistor is spaced laterally from the second semiconductor layer, the insulator layer, and the insulating trench of the insulator layer.

7. The integrated circuit of claim 6, wherein the second MOS transistor includes:

a second gate conductor;

second source and drain regions adjacent to the second gate conductor; and insulating third spacers on opposite sides of the second gate conductor and each having a varying width.

8. The integrated circuit of claim 6, wherein the first gate conductor partially covers the first surface of the insulating first and second spacers.

9. The integrated circuit of claim 6, wherein the insulating first spacer has a different width than the insulating second spacer.

10. The integrated circuit of claim 6, wherein the first gate conductor has a height that is greater than a height of the insulating first and second spacers.

11. A device, comprising:

a first transistor on a substrate, including:
   a first conductive gate; and
   first insulating spacers on opposite sides of the first conductive gate, the first insulating spacers having a tapered shape; and a second transistor on the substrate, including:
   a second conductive gate; and
   second insulating spacers on opposite sides of the second conductive gate, the second insulating spacers having a substantially parallelepiped shape;

a first semiconductor layer, the second insulating spacers of the second transistor contacting the first semiconductor layer; and an insulating layer between the first semiconductor layer and the first insulating spacers of the first transistor.

12. The device of claim 11, comprising an insulating trench extending into the first semiconductor layer and between the first transistor and the second transistor.

13. The device of claim 12, wherein the insulating layer extends laterally over the first semiconductor layer and contacts the insulating trench.

14. The device of claim 11, comprising a second semiconductor layer on the insulating layer, the first insulating spacers of the first transistor extending at least partially into the second semiconductor layer.

15. The device of claim 11, wherein the first insulating spacers have a height that is greater than a height of the second insulating spacers.

16. The device of claim 11, wherein the second transistor further includes:

conductive spacers on sides of each of the second insulating spacers, each of the second insulating spacers contacting the second conductive gate and extending between the second conductive gate and a respective one of the conductive spacers.

17. The device of claim 16, wherein the second insulating spacers and the conductive spacers extend at least partially into the first semiconductor layer.

18. The device of claim 16, wherein the conductive spacers have a tapered shape.

* * * * *